US012727427B2

(12) United States Patent
Patel et al.

(10) Patent No.: US 12,727,427 B2
(45) Date of Patent: Sep. 1, 2026

(54) SUBSTRATE SUPPORT DEVICE WITH DIAGNOSTIC CAPABILITIES

(71) Applicant: Applied Materials, Inc., Santa Clara, CA (US)

(72) Inventors: Deepak Patel, Karnataka (IN); Pandu Maddherla, Karnataka (IN); Sushant S. Koshti, Sunnyvale, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 18/233,788

(22) Filed: Aug. 14, 2023

(65) Prior Publication Data

US 2025/0062143 A1 Feb. 20, 2025

(51) Int. Cl.

| | |
|---|---|
| ***H10P 72/00*** | (2026.01) |
| ***B33Y 10/00*** | (2015.01) |
| ***B33Y 80/00*** | (2015.01) |
| ***H10P 72/50*** | (2026.01) |
| ***H10P 72/76*** | (2026.01) |

(52) U.S. Cl.

CPC .......... *H10P 72/0606* (2026.01); *B33Y 10/00* (2014.12); *B33Y 80/00* (2014.12); *H10P 72/0602* (2026.01); *H10P 72/0616* (2026.01); *H10P 72/50* (2026.01); *H10P 72/7612* (2026.01); *H10P 72/7614* (2026.01); *H10P 72/7621* (2026.01)

(58) Field of Classification Search

CPC ......... H01L 21/67248; H01L 21/67259; H01L 21/67265; H01L 21/67288; H01L 21/68; H01L 21/68742; H01L 21/6875; B33Y 80/00; B33Y 10/00; H10P 72/0606; H10P 72/0602; H10P 72/0612; H10P 72/0616; H10P 72/7621; H10P 72/7614

USPC .................................................... 414/222.02

See application file for complete search history.

(56) References Cited

U.S. PATENT DOCUMENTS

| | | | | |
|---|---|---|---|---|
| 5,980,195 | A * | 11/1999 | Miyashita | H01L 21/67772 414/941 |
| 8,207,476 | B2 | 6/2012 | Tsukamoto | |
| 8,924,014 | B2 | 12/2014 | Balan | |
| 9,812,372 | B2 | 11/2017 | Choi | |
| 2006/0215347 | A1* | 9/2006 | Wakabayashi | H01L 21/67167 361/234 |
| 2016/0039196 | A1* | 2/2016 | Harris | H01L 21/682 269/254 R |

(Continued)

*Primary Examiner* — Michael Mccullough
*Assistant Examiner* — Jessica L Burkman
(74) *Attorney, Agent, or Firm* — Lowenstein Sandler LLP

(57) ABSTRACT

A load lock including a substrate support device for supporting a substrate, and an indexer coupled to the substrate support device. The substrate support device may take measurements and acquire data to verify features of the supported substrate and an associated manufacturing system. Substrate features that are measured include, substrate temperature, substrate warping, and a substrate presence, absence, or misplacement on the support device. System features that are measured include system vibrations and substrate transfer mechanism calibration data. The substrate support device sensors and communications circuits can be integrated into the substrate support device, through use of an additive manufacturing process in making the substrate support device.

15 Claims, 9 Drawing Sheets

(56) References Cited

U.S. PATENT DOCUMENTS

2017/0303338 A1* 10/2017 Parkhe ................. H05B 3/0047
2020/0008275 A1* 1/2020 Hirochi ................ H05B 6/6447
2022/0013387 A1 1/2022 Yamada
2023/0060570 A1* 3/2023 Lee ................... H01L 21/67051

* cited by examiner

SUBSTRATE SUPPORT DEVICE WITH DIAGNOSTIC CAPABILITIES

TECHNICAL FIELD

Embodiments of the present disclosure relate generally to a substrate support device for supporting a substrate or a wafer, and in particular to a substrate support device located within a load lock chamber of an electronic device manufacturing system and having one or more integrated sensors.

BACKGROUND

An electronic device manufacturing system may include a factory interface (which may be, e.g., an Equipment Front End Module or EFEM) configured to receive substrates upon which electronic devices may be manufactured, a transfer chamber for transferring substrates to and from process chambers, and one or more load locks separating the transfer chamber from the factory interface.

Over time, conditions and components of the factory interface, load lock, process chambers, or other systems of the electronic device manufacturing system can degrade. For instance, a load lock may accumulate dirt or contaminates, components within and of the load lock may mechanically deteriorate or fail, and so on. Such degradation within the load lock or any other chambers may negatively affect the characteristics and finish quality of the processed substrates.

Moreover, since substrate processes are conducted in precisely controlled and isolated environments, degraded processing systems and errors affecting substrate quality may occur and go unnoticed until much later when a substrate is released from the system and manually inspected.

These unsatisfactory processing conditions that are left unattended jeopardize the substrate, end products, and equipment, leading to decrease throughput, and increase costs through system down time and part maintenance.

SUMMARY

In an aspect of the disclosure, a load lock of an electronic device manufacturing system is provided, the load lock, comprising: a substrate support device, comprising: a base; a first tower portion and a second tower portion extending vertically from the base; a plurality of arms, extending laterally from the first tower portion and the second tower portion, configured to support a substrate; and an integrated sensor, configured to sense a property of at least one of the substrate support device, the load lock, an environment of the load lock, or a substrate; and an indexer, attached to the substrate support device, configured to adjust a vertical position of the substrate support device.

In an aspect of the disclosure, a method of forming a monolithic substrate support device of a load lock is provided, the method comprising: forming, through an additive manufacturing process, a first portion of the substrate support device, the first portion comprising one or more channels; embedding an electrical component into the one or more channels of the first portion of the substrate support device; forming, through the additive manufacturing process, a second portion of the substrate support device on the first portion of the substrate support device, wherein the second portion of the substrate support device at least partially covers the electrical component.

In an aspect of the disclosure, a monolithic substrate support device for a load lock is provided, the monolithic substrate support device comprising: a base; a first tower portion and a second tower portion extending vertically from the base; a plurality of arms, extending laterally from the first tower portion and the second tower portion, configured to support a substrate; and an integrated sensor, configured to sense a property of at least one of the substrate support device, the load lock, an environment of the load lock, or a substrate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

The drawings, described below, are for illustrative purposes only and are not necessarily drawn to scale. The drawings are not intended to limit the scope of the disclosure in any way.

DETAILED DESCRIPTION OF EMBODIMENTS

Figure 1:
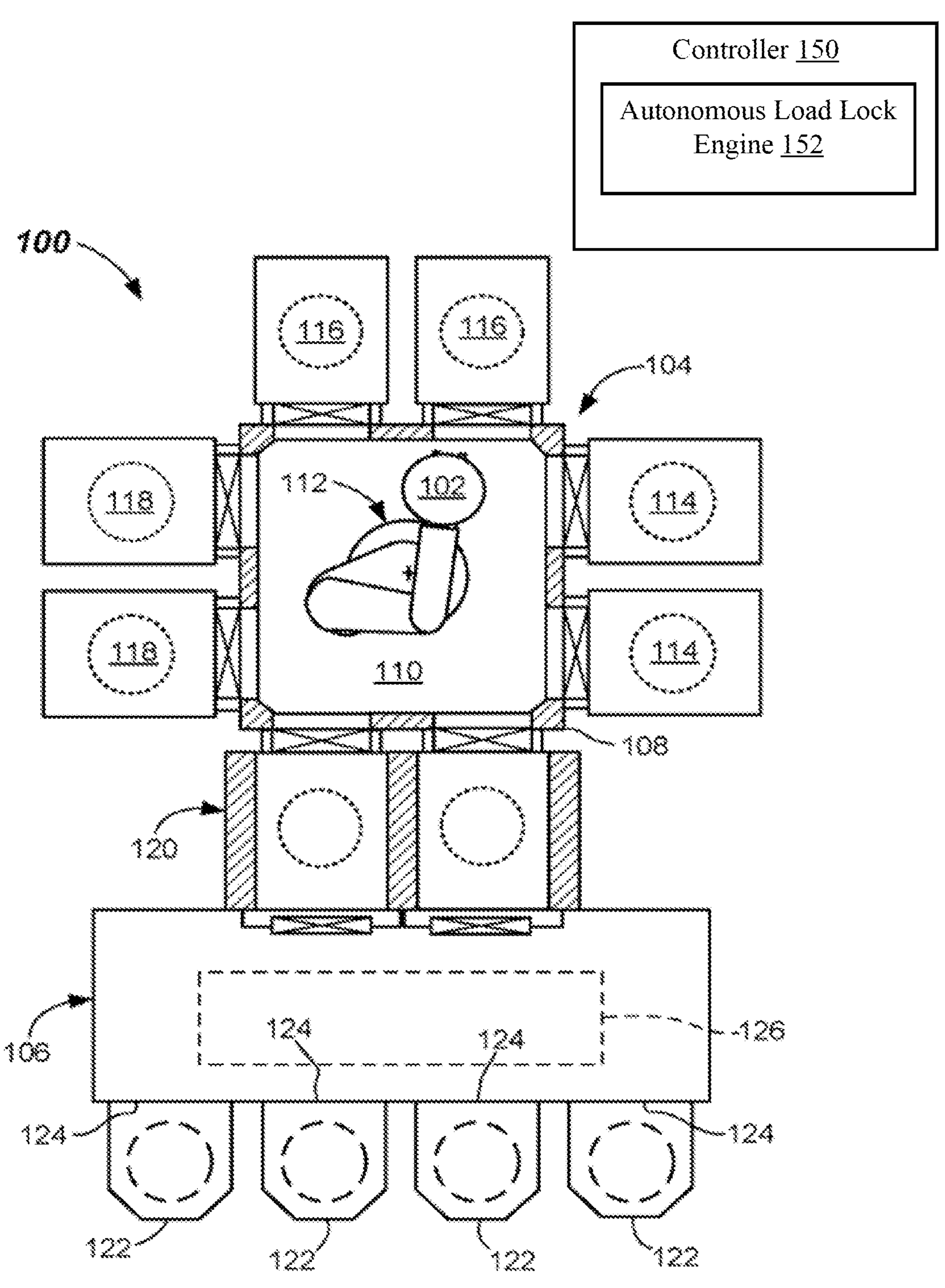
FIG. 1 illustrates a top-down view of an exemplary embodiment of a substrate manufacturing system, including a load lock system, and its placement among other processing chambers and equipment in a factory setting.

Embodiments described herein are related to a load lock system including a diagnostics-capable load lock substrate support device. The load lock system and substrate support device may be used in a processing or manufacturing system, such as a substrate processing or manufacturing system.

Embodiments described herein are directed to a load lock system and substrate support device that includes integrated sensors to perform diagnostics both on one or more supported substrate and on the manufacturing system at large (e.g., on the substrate support device, an indexer attached to the substrate support device, on the load lock, on an environment of the load lock, etc.). The load lock substrate support device can include an integral photoelectric sensor for sensing features and diagnostics of a supported substrate. The load lock substrate support device can include an integral vibration sensor to sense vibrations data through the load lock substrate support device and/or an indexer that is attached to the substrate support device. The load lock substrate support device can also detect the temperature of a supported substrate through integrated thermal sensors of the substrate support device. The load lock substrate support device can further be used to calibrate the position of a substrate transfer mechanism through use of an integral reflective sensor and/or through sensor to sense a position of the substrate transfer mechanism.

In some embodiments, the load lock substrate support device can be manufactured using a method of additive manufacturing. This enables the sensors to be integral to the load lock substrate support device, no matter the complexity of the substrate support device design. This method of manufacture also enables electrical communications conduits (e.g. conductive wire(s)) to be embedded into the substrate support device.

Added benefits of this manufacturing method for the substrate support device include a smaller part count, uniform density, uniform material composition, decreased weight, higher rigidity, potentially tighter design tolerances, resilience against vibrations, and the ability to embed electrical components into complex device geometries.

The components of the embodiments as generally described and illustrated in the figures herein can be arranged and designed in a wide variety of different configurations. Thus, the detailed description of various embodiments, as represented in the figures, is not intended to limit the scope of the present disclosure is merely representative of various embodiments. While various aspects of the embodiments are presented in drawings, the drawings are not necessarily drawn to scale unless specifically indicated. The phrase "coupled to" is broad enough to refer to any suitable coupling or other form of interaction between two or more entities, including direct and/or indirect mechanical, fluidic and thermal interaction. Thus, two components may be coupled to each other even though they are not in direct contact with each other. The phrases "attached to" or "attached directly to" refer to interaction between two or more entities which are in direct contact with each other and/or are separated from each other only by a fastener of any suitable variety (e.g., mounting hardware or an adhesive). The phrase "fluid communication" is used in its ordinary sense, and is broad enough to refer to arrangements in which a fluid (e.g., a gas or a liquid) can flow from one element to another element when the elements are in fluid communication with each other.

Referring now to the figures, FIG. 1 is a diagram of a cluster tool 100 (also referred to as a system, substrate processing system or manufacturing system) that is configured for substrate fabrication (e.g., for fabrication of semiconductor devices, displays, photovoltaic devices, etc.) in accordance with at least some embodiments of the disclosure. In an exemplary embodiment, manufacturing system 100 may comprise a processing portion 104, a transfer chamber 110, a load lock 120, a factory interface 106, and substrate carriers 122 or front opening unified pods (FOUPs). Processing portion 104 may comprise a plurality of process chambers 114, 116, and 118, wherein specific and controlled substrate manufacturing processes occur. Transfer chamber 110 may house a transfer robot 112 comprising a substrate transfer mechanism, or end effector (substrate transfer mechanism and end effector will be used interchangeable moving forward in the disclosure) that may transport substrates 102. Transfer chamber 110 may be in transfer chamber housing 108. Load lock 120 may interface with both the processing portion 104 and the factory interface 106. Factory interface 106 may comprise a factory interface robot 126, for transferring substrates to and from the carriers 122 and the load lock 120. Factory interface may further comprise a plurality of load ports 124 for receiving carriers 122 carrying one or more substrates. Transfer chamber 110 is generally maintained at vacuum pressure levels, while factory interface 106 is generally maintained at atmospheric pressure.

In some embodiments, transfer chamber 110 and process chambers 114, 116, and 118, may be maintained at a vacuum level. Load lock 120 may alternate pressures between a vacuum level (e.g., when opened to transfer chamber 110) and atmospheric pressure (e.g., when opened to factory interface 106). The vacuum level for the transfer chamber 110 may range from about, e.g., 0.01 Torr (10 mTorr) to about 80 Torr. Other vacuum levels may be used.

The factory interface robot 126 is configured to transfer the substrate from the FOUPs 122 to load locks 120 through load lock doors. The number of load locks can be more or less than two but for illustration purposes only, two load locks 120 are shown with each load lock having a door (e.g., a slit valve) to connect it to the factory interface 106 and a door to connect it to the transfer chamber 110. Load locks 120 may or may not be batch load locks. In embodiments, the load locks are smart load locks capable of performing self-diagnosis and/or automated prevention and/or recovery. In embodiments, the load locks include one or more substrate support devices having integrated sensors that provide "smart" functionality for the load locks. The substrate support devices used in embodiments are described in further detail below.

The load locks 120, under the control of a controller 150, can be maintained at either an atmospheric pressure environment or a vacuum pressure environment, and serve as an intermediary or temporary holding space for a substrate that is being transferred to/from the transfer chamber 110. The transfer chamber includes robot arm 112 that is configured to transfer the substrate from the load locks 120 to one or more of the plurality of processing chambers 114, 116, 118 (also referred to as process chambers), or to one or more pass-through chambers (also referred to as vias), without vacuum break, i.e., while maintaining a vacuum pressure environment within the transfer chamber 110 and the plurality of processing chambers 114, 116, 118. The load locks 120 may be used to hold hot substrates that are at an elevated temperature due to recent processes performed on the substrates. In some embodiments, the substrate support device in the load lock includes a temperature sensor to measure the temperature of the substrate. The substrate may be held until the substrate cools down to a target temperature, after which the factory interface robot may retrieve the substrate from the load lock 120. Additionally, the load locks 120 may be used to hold substrates while they are heated to pre-processing temperatures that are close to temperatures that the substrates will be heated to during processing by one or more processing chambers 114, 116, 118. The load locks 120 may include one or more heaters disposed therein for heating of the substrates. In some embodiments, the substrate support device in the load lock includes a temperature sensor to measure the temperature of the substrate. The substrate may be held until the substrate is heated to a target temperature, after which the transfer chamber robot may retrieve the substrate from the load lock 120.

A door, e.g., a slit valve door, connects each respective load lock 120 to the transfer chamber 110. A door also connects each respective load lock 120 to the factory interface 106. The plurality of processing chambers 114, 116, 118 are configured to perform one or more processes. Examples of processes that may be performed by one or more of the processing chambers 114, 116, 118 include cleaning processes (e.g., a pre-clean process that removes a surface oxide from a substrate), anneal processes, deposition processes (e.g., for deposition of a cap layer, a hard mask layer, a barrier layer, a bit line metal layer, a barrier metal layer, etc.), etch processes, and so on. Examples of deposition processes that may be performed by one or more of the process chambers include physical vapor deposition (PVD), chemical vapor deposition (CVD), atomic layer deposition (ALD), and so on. Examples of etch processes that may be performed by one or more of the process chambers include plasma etch processes.

Controller 150 (e.g., a tool and equipment controller, a tool cluster controller, etc.) may control various aspects of the cluster tool 100, e.g., gas pressure in the processing chambers, individual gas flows, spatial flow ratios, plasma power in various process chambers, temperature of various chamber components, radio frequency (RF) or electrical state of the processing chambers, and so on. The controller 150 may receive signals from and send commands to any of the components of the cluster tool 100, such as the robot arms 112, 126, process chambers 114, 116, 118, load locks 120, substrate supports of load locks, slit valve doors, and/or one or more sensors (e.g., integrated in one or more substrate supports of load locks), and/or other processing components of the cluster tool 100. The controller 150 may thus control the initiation and cessation of processing, may adjust a deposition rate and/or target layer thickness, may adjust process temperatures, may adjust a type or mix of deposition composition, may adjust an etch rate, may initiate automated prevention and/or recovery processes on the load lock 120, and the like. The controller 150 may further receive and process sensor measurement data (e.g., optical measurement data, vibration data, spectrographic data, particle detection data, temperature data, etc.) from various sensors (e.g., sensors integrated into substrate support devices of load locks 120) and make decisions based on such measurement data.

In various embodiments, the controller 150 may be and/or include a computing device such as a personal computer, a server computer, a programmable logic controller (PLC), a microcontroller, and so on. The controller 150 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 150 may include a data storage device (e.g., one or more disk drives and/or solid state drives), a main memory, a static memory, a network interface, and/or other components. The processing device of the controller 150 may execute instructions to perform any one or more of the methodologies and/or embodiments described herein. The instructions may be stored on a computer readable storage medium, which may include the main memory, static memory, secondary storage and/or processing device (during execution of the instructions). In some embodiments, controller 150 is a dedicated controller for load lock(s) 120.

In embodiments, the processing device and memory of controller 150 have an increased capacity as compared to processing power and memory size of traditional controllers for cluster tools. In embodiments, the processing device and memory are sufficient to handle parallel execution and use of multiple trained machine learning models, as well as training of the machine learning models. For example, the memory and processing device may be sufficient to handle parallel execution of 6-15 different machine learning models (e.g., one or more for each of the process chambers 114, 116, 118, and/or load locks 120).

In one embodiment, the controller 150 includes an autonomous load lock engine 152. The autonomous load lock engine 152 may be implemented in hardware, firmware, software, or a combination thereof. The autonomous load lock engine 152 may be configured to receive and process measurement data generated by one or more sensors of load locks 120 (e.g., of integrated sensors in substrate support devices of load locks 120) during and/or after cycling of substrates through the load locks. The sensor measurements may include temperature measurements, pressure measurements, particle measurements, spectrographic measurements, vibration measurements, accelerometer measurements, voltage measurements, current measurements, resistance measurements, time measurements, optical measurements (e.g., such as optical emission spectrometry measurements and/or reflectometry measurements), position measurements, humidity measurement, part health measurements, and/or other types of measurements. Some example measurements include a chamber pressure (e.g., which may be measured in mTorr), OES spectra measurements for one or more wavelengths or frequencies (e.g., for wavelengths of 3870 nm, 7035 nm, 775 nm, and so on), one or more substrate support/heater temperatures, one or more substrate temperatures, and so on. In some embodiments, some or all of these measurements may be combined to generate a feature vector that is input into a trained machine learning model of the autonomous tool engine 121. In some embodiments, some or all of these measurements may be input into a rules-based engine that may determine one or more actions to perform based on the measurement(s) satisfying one or more criteria or rules.

In some embodiments, some types of measurements may be generated by sensors integrated with the load locks. In other embodiments, as discussed below, sensors may be placed or integrated with devices including substrate support devices of the load locks.

The autonomous load lock engine 152 running on controller 150 may include one or more rules-based engines and/or trained machine learning models for controlling and/or making decisions for one or more load locks. The one or more trained machine learning models may have been trained to receive sensor measurements from and/or associated with a load lock and to make a prediction, classification or determination about the load lock. Each of the trained machine learning models may be associated with a different decision-making process for a load lock in embodiments. Alternatively, one or a few trained machine learning models may be associated with multiple decision-making processes for a load lock in embodiments.

In one embodiment, one or more of the trained machine learning models is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, percentage regression, leas absolute deviations, nonparametric regression, scenario optimization and/or distance metric learning may be performed to train the regression model.

In one embodiment, one or more of the trained machine learning models are decision trees, random forests, support vector machines, or other types of machine learning models.

In one embodiment, one or more of the trained machine learning models is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

One of more of the trained machine learning models may be recurrent neural networks (RNNs). An RNN is a type of neural network that includes a memory to enable the neural network to capture temporal dependencies. An RNN is able to learn input-output mappings that depend on both a current input and past inputs. The RNN will address past and future measurements and make predictions based on this continuous measurement information. For example, sensor measurements may continually be taken during a process, and those sets of measurements may be input into the RNN sequentially. Current sensor measurements and prior sensor measurements may affect a current output of the trained machine learning model. One type of RNN that may be used is a long short term memory (LSTM) neural network.

Some trained machine learning models of an autonomous load lock engine 152 use all sensor measurements generated by a load lock and/or associated devices. Some trained machine learning models of an autonomous load lock engine 152 use a subset of generated sensor measurements.

Controller 150 may be operatively connected to a server (not shown). The server may be or include a computing device that operates as a factory floor server that interfaces with some or all tools in a fabrication facility. The server may perform training to generate the trained machine learning models, and may send the trained machine learning models to autonomous load lock engine 152 on controller 150. Alternatively, the machine learning models may be trained on controller 150.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

Figure 2A:
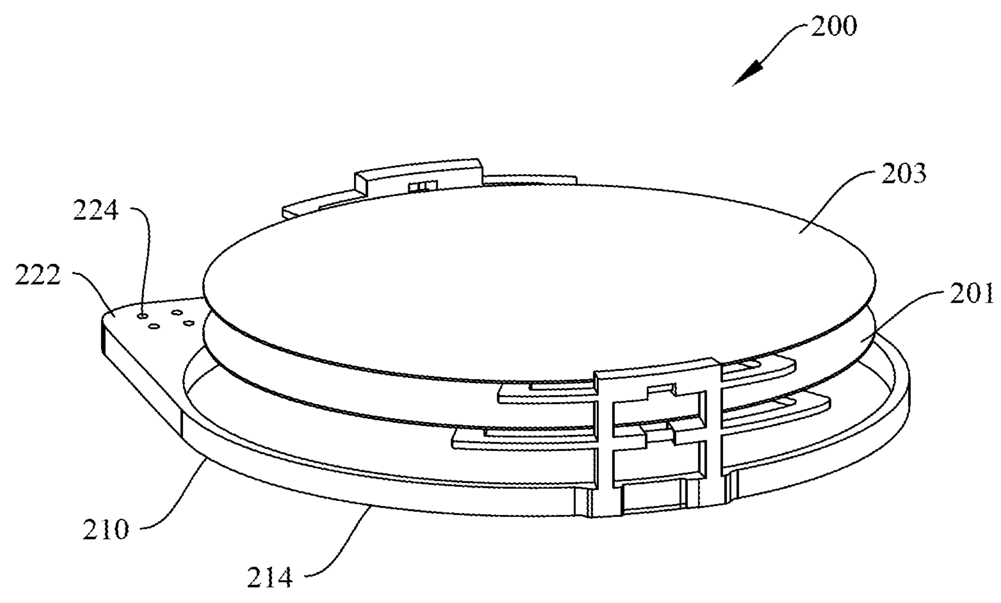
FIG. 2A illustrates a perspective view of a load lock substrate support device and substrates, according to certain embodiments.

FIG. 2A illustrates an exemplary embodiment of a load lock substrate support device 200. In embodiments, load lock substrate support device 200 is a monolithic substrate support device manufactured using an additive manufacturing process. Load lock substrate support device 200 may include a base portion 210. In some embodiments, base portion 210 may include a hoop portion 214 and attaching portion 222. Attaching portion 222 may include screw holes 224. FIG. 2A further illustrates two substrates, 201 and 203, which may rest on, or be supported by, the load lock substrate support device 200.

In some embodiments, the base portion 210 may include an attaching portion 222 that is used to attach the substrate support device to other devices of the electronic device manufacturing system. In some embodiments, the attaching portion 222 can attach to a load lock or another static device of the electronic device manufacturing system, e.g. a base. In other embodiments attaching portion 222 can attach to an actuator, or an indexer, or any other device capable of displacing the substrate support device 200. Attaching portion 222 may, for example, attach to an indexer that can move the substrate support device 200 vertically (e.g., up and/or down).

In some embodiments, as seen in FIG. 2A, attaching portion 222 can be a portion beside hoop portion 214 (e.g., that extends laterally from hoop portion 214). In other embodiments, attaching portion 222 may be positioned vertically with respect to hoop portion 214. In other embodiments, attaching portion 222 may be integral with hoop portion 214. One of ordinary skill in the art, having the benefit of this disclosure will be to design multiple locations for placing and/or integrating an attaching portion 222 and its functionality on a substrate support device 200.

In some embodiments, as seen in FIG. 2A, attaching portion 222 includes screw holes 224 to accommodate screws, bolts and/or other fasteners to attach the substrate support device 200 to other devices. In other embodiments, attaching portion 222 may include any kind of mechanical attaching mechanisms, including, but not limited to, any type of screws, bolts, nuts, rivets, pins, staples, clips, clamps, snap fits, ties, welded portions, latches, or magnets, electromagnets, and any other similar mechanisms or combination of such mechanisms. One of ordinary skill in the art, having the benefit of this disclosure, will be to design multiple methods and mechanisms for attaching base portion 210 of the substrate support device 200 to a static location or to a separate device.

In some embodiments, the substrate support device can be displaced vertically up or down within a load lock. In some embodiments this movement can serve a variety of purposes such as aiding in procuring measurements, or aiding in placing or removing a substrate onto/off of the device. In some embodiments, the substrate support device can be displaced in a rotational motion either separately, or concurrently with, translational motion within and with respect to the load lock chamber. In some embodiments, an indexer, actuator, or motor attached to the substrate support device can facilitate any one or more these types of displacements.

In some embodiments, the actuator or indexer, or other displacement mechanism can be attached at attaching portion 222.

In some embodiments, hoop portion 214 may form a circumference with an empty inner area, so as to form a hoop, and in this way accommodate a circular substrate. In some embodiments, the hoop portion may extend radially inward some distance. In some embodiments, the radially inner portion surrounded by the hoop portion 214 may not include a hole, i.e. the substrate support device 200 may include a base portion 210 that extends mostly, or entirely, from a first lateral side to a second lateral side of the substrate support device 200.

In some embodiments, the hoop portion 214 may not be circular, and may be substantially more, or completely, rectangular or any other shape so as to facilitate securely supporting one or more substrates. In some embodiments, the shape of the hoop portion 214 may be selected so as to maximize rigidity and structural integrity of the substrate support device 200. In other embodiments, the shape of the hoop portion 214 may be selected so as to maximize efficient manufacturing and/or manufacturability of the substrate support device 200. In some embodiments, a combination of these, or other, goals may be pursued through the shape of hoop portion 214 and base 210. One of ordinary skill in the art, having the benefit of this disclosure will be to envision multiple designs and shapes base portion 210 and the device as a whole to prioritize any one or more of the above goals.

In some embodiments, substrates 201 and 203 may be a wafer (e.g., such as a semiconductor wafer). In some embodiments, substrates 201 and/or 203 may be circular, or square, or any other shape.

In some embodiments, substrates 201 and/or 203 may be made out of one or more materials including Silicon, Germanium, Gallium Arsenide (GaAs), silicon dioxide (SiO2 or silica), Indium Phosphide (InP), Silicon Germanium (SiGe), Silicon Carbide (SIC), Gallium Nitride (GaN), glass, or any one or more materials commonly used within electronic device manufacturing systems. In some embodiments, substrates 201 and/or 203 may be formed from one material. In other embodiments, substrates 201 and/or 203 may be formed from a homogenous mixture of materials. In other embodiments, substrates 201 and/or 203 may be made out of one or more stacked layers of one or more differing materials. By way of example, substrates 201 and/or 203 may be silicon on insulator (SOI) wafers, where a layer of SiO2 is placed vertically between two insulative silicon layers.

In some embodiments, load lock substrate support device 200 may support substrates 201 and/or 203 passively through the substrates 201 and/or 203 resting on portions of substrate support device 200. In some embodiments, substrate support device 200 may actively, or mechanically hold, latch, or grab substrates 201 and/or 203. Substrate support device 200 may use a latch, actuator, magnets, form fitting portions, clips or any other similar mechanism or combination of mechanisms for actively holding one or more substrates.

Figure 2B:
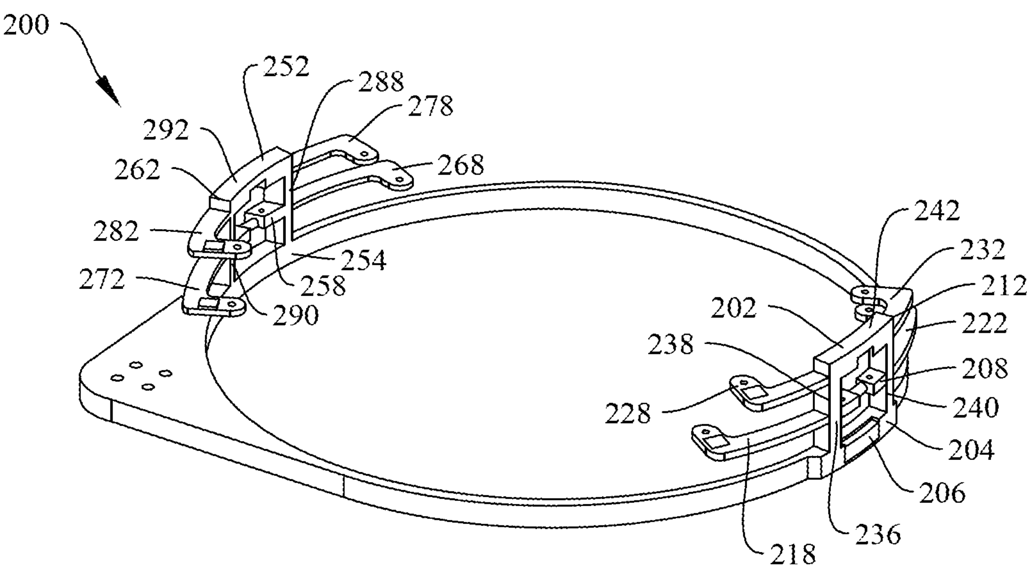
FIG. 2B illustrates a perspective view of an exemplary embodiment of the load lock substrate support device of FIG. 2A.

FIGS. 2A-2B illustrate a substrate support device 200 capable of supporting one or two substrates. In some embodiments, substrate support device 200 may support only one substrate; in some embodiments, substrate support device 200 may support more than two substrates. One of ordinary skill in the art, having the benefit of this disclosure, will be able to envision a substrate support device making use of a variety of systems, mechanisms, and shapes for passively, or actively, supporting or holding one, or any number of, substrates.

FIG. 2B illustrates an exemplary embodiment of the monolithic load lock support device 200 with first and second tower portions 202 and 252. First tower portion 202 may include base level 204, first level 208, second level 212, left lower arm portion 218, right lower arm portion 222, left upper arm 228, right upper arm 232, left strut 238, right strut 240, and top 242. Base level 204 can include first sensor element 206. Second tower portion 252 may include base level 254, first level 258, second level 262, left lower arm 268, right lower arm 272, left upper arm 278, right upper arm 282, left strut 288, right strut 290 and top 292. Base level 254 can include a first sensor element. First level 258 can include a second sensor element. Second level 262 can include third sensor element. Note that first, second, and third sensor element of second tower portion 252 are not seen in the perspective seen in FIG. 2B; they will be described generally here, and in detail with respect to FIGS. 4A-4B and 6A-6B).

In an embodiment, struts 238, 240, 288 and 290 of the tower portions 202 and 252 may extend vertically from the hoop portion of the substrate support device 200, and provide a rigid structure to support sensors and arm portions 218, 222, 228, 232, 268, 272, 278, and 282.

In some embodiments, struts 238, 240, 288 and 290 may be placed radially inward or radially outward of the hoop portion of the device 200, while still being coupled to the hoop portion of the device 200. In some embodiments, struts 238, 240, 288 and 290, and first and second tower portion 202 and 252 may be diametrically opposed to each other on the hoop portion of the substrate support device 200. In other embodiments, additional tower portions similar to tower portions 202 and 252 may be used. One of ordinary skill in the art, having the benefit of this disclosure, will be able to envision a substrate support device making use of one or more tower portions, and similar structures and shapes for providing sensors and support structures for further components.

In an additional embodiment, arm portions 218, 222, 228, 232, 268, 272, 278, and 282, may extend laterally from tower portions 202 and 252 and struts 238, 240, 288 and 290 and include a portion that bends radially inward with respect to a hoop portion of the device 200. In an embodiment arm portions 218, 222, 228, 232, 268, 272, 278, and 282 may extend laterally with a bend, or curve, and follow the curvature of a hoop portion of the substrate support device 200. In other embodiments, arm portions 218, 222, 228, 232, 268, 272, 278, and 282 may not include a bend or curve, and may not follow a curvature of the substrate support device 200 at large. In some embodiments, arm portions 218, 222, 228, 232, 268, 272, 278, and 282 may be mostly flat portions in a vertical dimension. In some embodiments, a supported substrate may rest on the portion of arm portions 218, 222, 228, 232, 268, 272, 278, and 282 that bends radially inward with respect to the circumference of the hoop portion. In other embodiments, a supported substrate may rest on other portions of the arm portions, including a curved portion of the arm portions. In some embodiments, arm portions 218, 222, 228, 232, 268, 272, 278, and 282 may include active elements to support, or hold, one or more substrates, including latches, actuators, magnets, form fitting portions, clips or any other similar mechanism.

In some embodiments, four arms of arm portions 218, 222, 228, 232, 268, 272, 278, and 282 may each separately be associated with supporting a single substrate. In other embodiments of the substrate support device, less than four separate arms may be used to support a substrate; in further embodiments, more than four separate arms may be used to support a single substrate. One of ordinary skill in the art, having the benefit of this disclosure, will be able to envision multiple configurations and numbers of arm portions to support one or more substrates.

Figure 3:
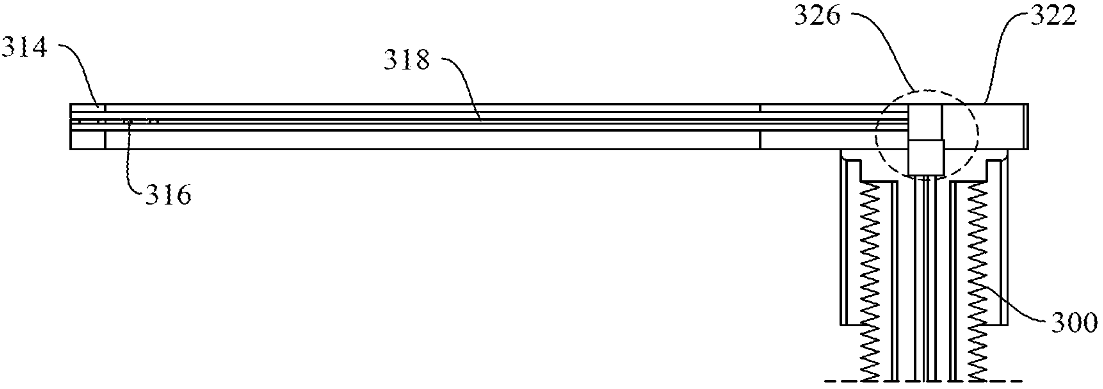
FIG. 3 illustrates a cutaway view of an exemplary embodiment of a load lock substrate support device and an indexer device.

FIG. 3 illustrates an exemplary embodiment of the load lock support device with a hoop portion 314, channel 316, electrical communications conduit(s) 318, attaching portion 322, and junction portion 326. In an embodiment of the device, the channel 316 extends throughout the hoop portion 314 of the substrate support device, so as to allow placement of at least one electrical communications conduit(s) 318 to connect a series of electrical components associated with the load lock support device.

In an embodiment of the device, attaching portion 322 may be similar to attaching portion 222 described with respect to FIG. 2A. In some embodiments, attaching portion 322, may include a portion of the hollow channel 316. In further embodiments, attaching portion 322 may include a junction portion 326, for detachably, or permanently, coupling one or more electrical communications conduit(s) 318 of the substrate support device with one or more conduit(s) (not shown) of an additional device, including in some embodiments an indexer device 300. In some embodiments, electrical communications conduit(s) 318 may be one or more copper, gold, or other metallic or electrically conductive wire. In other embodiments, electrical communications conduit(s) 318 may be one or more fiber optic cables, or a similar type of communications cable.

In some embodiments, indexer device 300 may serve to raise or lower the substrate support device, in some embodiments as was discussed with respect to FIG. 2A. In some embodiments, indexer device 300 may extend outside of a load lock chamber housing the substrate support device. Indexer device 300 may pass through a side, floor or exterior wall of the load lock chamber. Electronic communications cables similar to electrical communications conduit(s) 318 such as a fiber optic or electrical wire(s) may also run through the body of the indexer and connect to a processing device, server, or other electronics hardware (such as controller 150 or FIG. 1) existing outside of the load lock chamber and associated with the electronic device manufacturing system.

In some embodiments, indexer device 300 and the attached substrate support device may be displaced and/or actuated by a controller of the system (for example controller 150 of FIG. 1). In some embodiments, the method for displacing indexer device 300 and the attached substrate support device may include one or more of electrical actuators such as solenoids, direct current (DC) motors, stepper motors, servo motors, fluid actuators such as hydraulic or pneumatic actuators, or any other kind of mechanical, electrical, or fluidic type of actuator commonly used within an electronic device manufacturing system.

As discussed above, in an embodiment of the device, attaching portion 322 may comprise a junction portion 326 wherein the electrical communications conduit(s) 318 may detachably or permanently connect to wires from a separate component of the device. In some embodiments, electrical communications conduit(s) 318 may connect at junction portion 326 using one or more electrical connection mechanisms, including terminal blocks, terminal strips, crimp connectors, ring terminals, spade terminals, pin and sleeve connectors, wire soldering, or any other mechanism or systems for connecting electrical communications conduit(s) and commonly made of use within an electronic device manufacturing system.

In some embodiments, the load lock substrate support device, including hoop portion 314, attaching portion 322, and first and second tower portions (such as 202 and 252 from FIG. 2B) can be formed via a conventional method of manufacturing. In other embodiments, a method of additive manufacturing can be used to form the substrate support device. In some embodiments, additive manufacturing may be used such that the entire substrate support device may be one monolithic part. Employing a method of additive manufacturing may result in a number of desirable features for the substrate support device including, but not limited to, increased rigidity of the substrate support device, higher precision and accuracy for desired dimensions and tolerances of the substrate support device, uniform material consistency and density throughout the substrate support device, decreased part count (i.e. essentially just one part) for the substrate support device, decreased weight of the substrate support device, due in part to the absence of fasteners and connectors, and increased possibility for complexity of the design of the substrate support device, including the inclusion of the channel 316, which may extend through the body of the substrate support device. In some embodiments, channel 316 may be of a design that may not be possible to manufacture foregoing the use of additive manufacturing methods.

In some embodiments, the enhanced rigidity, uniform density, and uniform consistency enabled by an additive manufacturing of the substrate support device can result in dampened or limited transmission of mechanical vibrations throughout the device. This can result in added longevity of the device, as well as an increased capacity in fixedly coupling to other devices of the system.

In some embodiments, the monolithic and uniform nature of the substrate support device when formed by additive manufacturing can result in reduced cost due to the minimal assembly required for the part, reduced or altogether removed fasteners, and reduced material waste, since the design geometries can be formed without excess unusable material.

As discussed above, in some embodiments, this method of manufacturing can serve to allow for unique cavities or hollow structures located within the body of the substrate support device. This can enable further integration for electrical components such a communication conduit(s), wire(s), sensor(s), and other electronics devices commonly associated with the electronic device manufacturing system. In some embodiments, the channel 316 can extend throughout the entirety of the substrate support device, in whatever fashion and in whatever diameter and/or dimensions as necessary to support each sensor element of the substrate support device, such that every sensor may be integrated and no electrical components or wires may be unnecessarily exposed exterior of the substrate support device, or to the interior of the load lock chamber. In an embodiment, the electrical communications conduit(s) connecting all sensor elements and the sensor can be routed through internal cavities of the substrate support device. One of ordinary skill in the art, having the benefit of this disclosure, will be able to envision multiple designs for these hollow structures within the body to allow for integration of electronic components.

In some embodiments, the substrate support device can first be formed, and afterwards the electrical components, communications conduit(s), wire(s) and sensor(s) can be inserted into their corresponding locations. In other embodiments, the electrical components, communications conduit(s), wire(s), and/or sensor(s) may be placed at their respective locations with respect to the substrate support device as the device is being formed using additive manufacturing. In such a way, electrical components, communications conduit(s), wire(s), and sensor(s) associated with the substrate support device can be placed in locations that would be inaccessible after formation of the device. In such a way, new designs and placements of electrical components, communications conduit(s), wire(s), and sensor(s) may be created or enabled by additive manufacturing, that may be impossible through use of traditional (non-additive) manufacturing methods.

In some embodiments, the method of additive manufacturing for the substrate support device can include one, or any combination of, ultrasonic additive manufacturing (UAM), selective laser sintering (SLS), selective laser melting (SLM), electron beam melting (EBM), binder jetting (BJ), material jetting (MJ), or any other similar method of metallic additive manufacturing.

In some embodiments of the substrate support device the material that the substrate support device is made out of can include a metal that is initially in the form of a powder or a sheet, including but not limited to, stainless steel alloy(s), aluminum, aluminum alloy(s), titanium, titanium alloy(s), cobalt chrome alloy(s), nickel alloy(s), or any other type or metal or metal alloy commonly used in metallic additive manufacturing.

In other embodiments, the device can be formed through additive manufacturing and from a durable plastic and/or polymer, such as a nylon or polycarbonate, or any other suitable non-metallic and durable material commonly used in additive manufacturing.

Figure 4A:
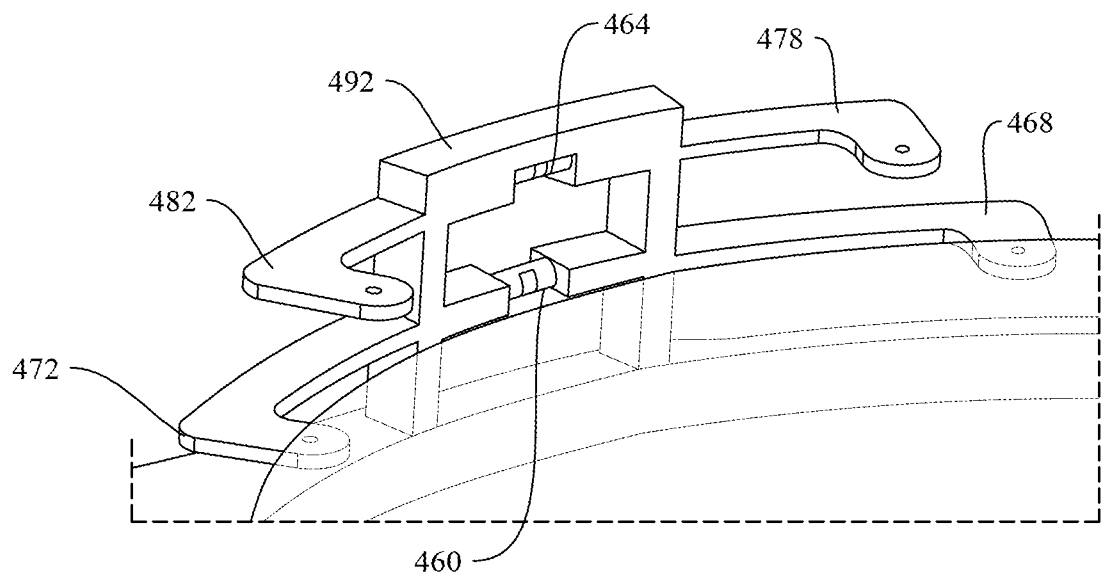
FIG. 4A illustrates a close-up view of an exemplary embodiment of an optical sensor elements of a load lock substrate support device.
Figure 4B:
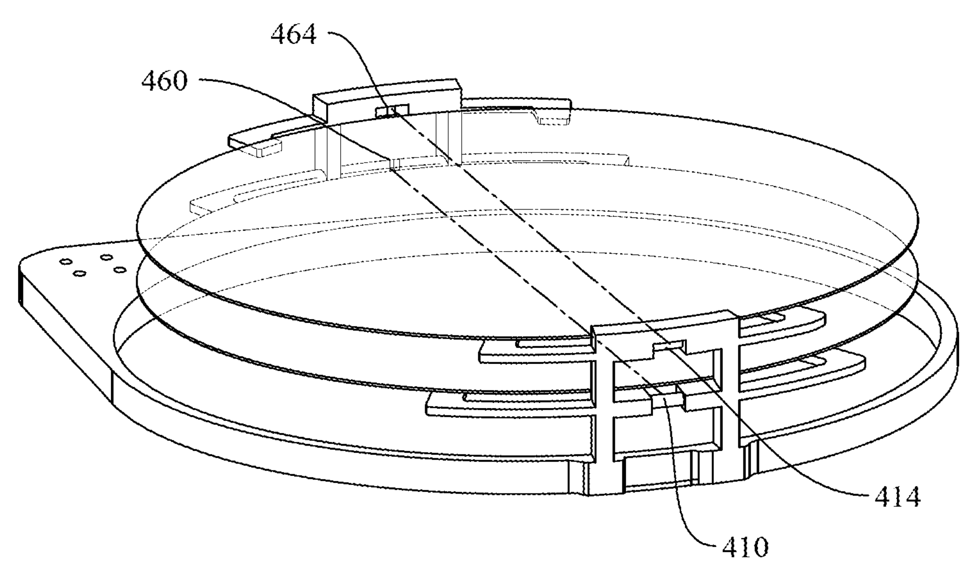
FIG. 4B illustrates a perspective view of an exemplary embodiment of the optical sensor elements of a load lock substrate support device.

FIGS. 4A and 4B illustrate an exemplary embodiment of the device second sensor elements 410 and 460, and device third sensor element 414 and 464. FIG. 4A further shows arm portions 468, 472, 478, and 482, and top 492 of second tower portion in relation to second and third sensor elements 460 and 464. In some embodiments, second and third sensor elements 410, 460, 414, and 464, together with or without their associated communications conduits(s), may be integrated within a body of the substrate support device. In some embodiments, second and third sensor elements 410, 460, 414, and 464 may be used to sense one, or any combination of, the presence, absence, displacement, misplacement, and/or characteristics associated with, a substrate supported by the substrate support device.

In an embodiment of the device, second sensor element 410 is placed on a first level of a first tower portion (described in FIG. 2B) and second sensor element 460 is placed on first level of second tower portion (described in FIG. 2B) such that second sensor elements 410 and 460 are placed at the same vertical height with respect to the load lock substrate support device. Third sensor element 414 is placed on the second level of first tower portion (described in FIG. 2B), and third sensor element 464 is placed on second level of the second tower portion (described in FIG. 2B), such that third sensor elements 414 and 464 are placed at the same vertical height with respect to the load lock substrate support device.

In some embodiments, second and third sensor elements may rest on a horizontal portion of the first and second towers that ensure the second and third sensor elements are at a similar vertical height with respect to the substrate support device. However, one of ordinary skill in the art, having the benefit of this disclosure, will be to design multiple locations for placing and/or integrating the second and third sensor elements with the substrate support device such that they share a vertical height.

In an embodiment of the device, sensor elements second and third sensor elements 410, 460, 414, and 464 may function in pairs, such that second sensor elements 410 and 460 are in communication with each other and third sensor elements 414 and 464 are in communication with each other. In some embodiments second sensor element 410 may send a signal that may be received at second sensor element 460. In some embodiments this may be reversed, and second sensor element 460 may send a signal that may be received at second sensor element 410. In some embodiments third sensor element 414 may send a signal that may be received at third sensor element 464. In some embodiments this may be reversed, and third sensor element 464 may send a signal to third sensor element 414.

In some embodiments, the signal transmitted and received by sensor elements 410, 460, 414, and 464 may be visible light, infrared light, laser light, or any other similar and practical type of electromagnetic radiation capable of being sent and detected by the sensor elements. In some embodiments, sensor elements 410, 460, 414, and 464 can be light sources or light detectors capable of generating and detecting any of the types of light and radiations described above.

In some embodiments, second and third sensor elements 410, 460, 414, and 464 may be photoelectric sensors of the through-beam type and sense the interruption of the signal by an interrupting body between a light source (e.g., laser emitter) and the sensor elements. In other embodiments, second and third sensor elements 410, 460, 414, and 464 may be photoelectric sensors of the reflective type, that transmit and receive signals at the same or nearby points in space and may sense the interruption of the signal by an interrupting body between the sensor element and a reflector.

In some embodiments seen in FIGS. 4A-4B the second and third sensor elements 410, 460, 414, and 464 may be placed at a vertical height such that they rest just above a first and/or second substrate supported by the substrate support device. Thus, the through-beam or reflective beam of the second and third sensor elements 410, 460, 414, and 464 may be interrupted by a substrate supported by the device at times.

In some embodiments, the presence or absence of a substrate on the substrate support device can be detected through use of the interruption time detected by the second and third sensor elements 410, 460, 414, and 464. The placement and/or removal of any substrate onto or from the substrate support device may interrupt the communications signal of any one of sensor element pairs 410 and 460, or 414 and 464. The sensor element pairs 410 and 460, or 414 and 464 can further detect the amount of time an object (e.g. the substrate) is interrupting the signal, and in conjunction with one or more computing subsystems, detect whether a substrate has been removed or placed on to the substrate support device. In some embodiments, the computing subsystem may contain a previously-known interruption time associated with removal and placement of a "typical" substrate on or off of the substrate support device. Thus, the second and third sensor elements 410, 460, 414, and 464 may be used to sense placement, removal, presence, and absence of a substrate on the substrate support device.

In some embodiments, the misplacement of a substrate on the substrate support device can be detected through use of abnormal interruptions detected by the second and third sensor elements 410, 460, 414, and 464. By way of example, a misplaced substrate on the substrate support device may continuously interrupt the communications signal of any one of sensor element pairs 410 and 460, or 414 and 464. The sensor element pairs 410 and 460, or 414 and 464 can detect the abnormal interruption, and in conjunction with one or more computing subsystems, detect whether a substrate is misplaced on the substrate support device. Thus, the second and third sensor elements 410, 460, 414, and 464 may be used to sense the misplacement of one or more substrates on the substrate support device.

In some embodiments, characteristics of a substrate on the substrate support device can be detected through use of the interruption time detected by the second and third sensor elements 410, 460, 414, and 464. As discussed above, the placement and/or removal of any substrate onto or from the substrate support device may interrupt the communications signal of any one of sensor element pairs 410 and 460, or 414 and 464. As was discussed above, the sensor element pairs 410 and 460, or 414 and 464 can further detect the amount of time an object (e.g. the substrate) is interrupting a signal of the sensors, and in conjunction with one or more computing subsystems, detect whether a substrate has been removed or placed on to the substrate support device. In some embodiments, when a substrate is warped, or otherwise contains certain defects affecting the thickness profile of the substrate, the effective and detected time of interruption of the signal may be larger (or smaller), or otherwise abnormal, during placement and/or removal of a substrate on, or off of, the substrate support device. This longer (or shorter) interruption time may be caused by an increased (or decreased) total or partial thickness of the substrate. In some embodiments, an associated one or more computing subsystem may contain a previously-known interruption time associated with removal and placement of a "typical" substrate on or off of the substrate support device. By comparison of the measured interruption time to this known value, the second and third sensor elements 410, 460, 414, and 464 may be used to detect characteristics, including certain defects, thickness, and warpage, of a substrate placed on the substrate support device. Thus, the second and third sensor elements 410, 460, 414, and 464 sensors may be used to detect a characteristic associated with a substrate supported by the substrate support device.

Multiple methods and systems may be used in the above methods to determine that the second and third sensor elements 410, 460, 414, and 464 sensors interruptions are associated with one, or any combination of, system characteristics including the presence, absence, displacement, misplacement, and/or characteristics associated with, a substrate supported by the substrate support device. By way of example, such methods may include a direct comparison of the detected interruption time with the known "typical" interruption time for a performed action. In other embodiments, complex computer methods, including the use of deep learning and machine learning or AI algorithms may be used to determine that the detected interruption times (normal or abnormal) are associated with (and with which specific system characteristic the interruption time is associated with) one or more of system characteristics including the presence, absence, displacement, misplacement, and/or characteristics associated with, a substrate supported by the substrate support device including defects and warpage. Above are two examples for determining these characteristics associated with the substrate support device; one of ordinary skill in the art, having the benefit of this disclosure, will be able to design multiple methods and systems utilizing the associated one or more computer subsystems and the previously-known interruption times discussed above to determine abnormalities associated with system characteristics including the presence, absence, displacement, misplacement, and/or characteristics associated with, a substrate supported by the substrate support device.

Thus, second and third sensor elements 410, 460, 414, and 464 may be used to sense system characteristics, including any one of, or any combination of, the presence, absence, displacement, misplacement, and/or characteristics associated with, a substrate supported by the substrate support device.

In some embodiments, any other type of object-detecting sensor may be used in place of the above photoelectric sensors, including, but not limited to physical proximity sensors such as piezoresistive, or other capacitive and resistive sensors, radar sensors, ultrasonic sensors, temperature sensors, image sensors, or any other kind of applicable sensor commonly used within electronic device manufacturing systems to detect an object. One of ordinary skill in the art, having the benefit of this disclosure, will be able to envision multiple sensor types, configurations, and methods to detect the presence, absence, displacement, misplacement, and/or characteristics of, a substrate supported by the substrate support device.

Figure 5A:
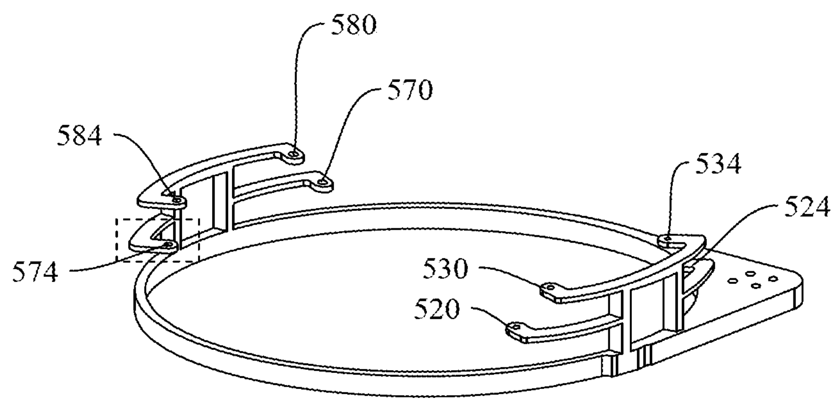
FIG. 5A illustrates a perspective view of an exemplary embodiment of a series of temperature sensing elements of a load lock substrate support device.
Figure 5B:
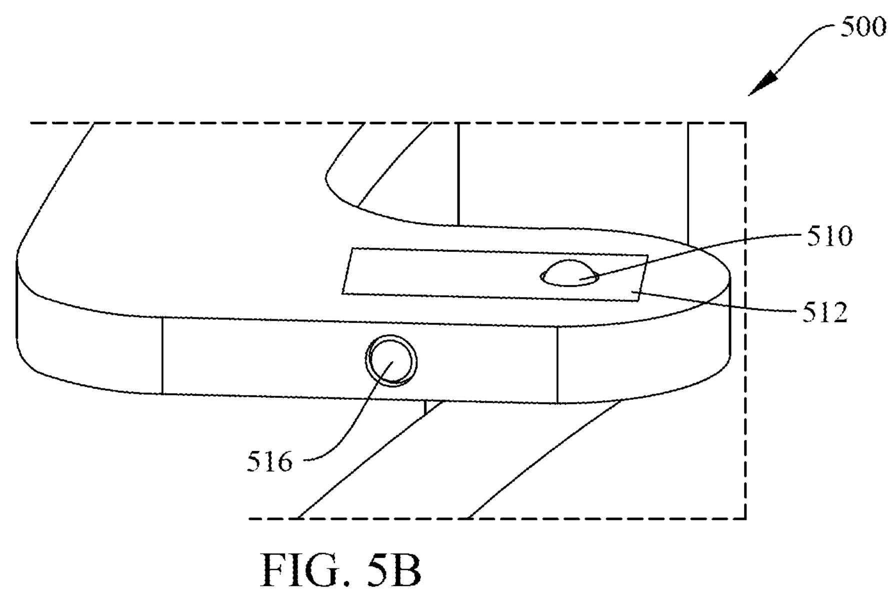
FIG. 5B illustrates a close-up view of an exemplary embodiment of the temperature sensing element of a load lock substrate support device.
Figure 5C:
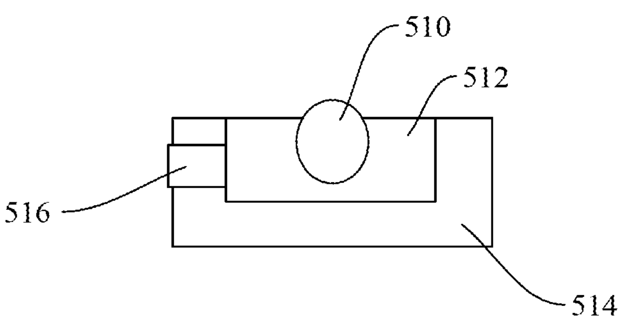
FIG. 5C illustrates a cut-away view of an exemplary embodiment of the temperature sensing element of a load lock substrate support device.

FIGS. 5A-5C illustrate an exemplary embodiment of the device comprising thermal sensors 520, 524, 530, 534, 570, 574, 580, and 584. In an embodiment of the device, thermal sensors 520, 524, 530, 534, 570, 574, 580, and 584 may be placed on the portion of arm portions 218, 222, 228, 232, 268, 272, 278, and 282 (as were described in FIG. 2B) that contact a substrate that rests on substrate support device, such that thermal sensors 520, 524, 530, 534, 570, 574, 580, and 584 may directly contact the device. In a separate embodiment of the substrate support device, not every arm supporting a substrate may comprise a thermal sensor.

In some embodiments, thermal sensors 520, 524, 530, 534, 570, 574, 580, and 584 can include contact thermal sensors such as a silicon-semiconductor thermometer (SST)

514, however in other embodiments, thermal sensors 520, 524, 530, 534, 570, 574, 580, and 584 can include thermocouples, resistance temperature detectors (RTDs), thermistors, or non-contact thermal sensors such infrared (IR) sensors, or any other kind of thermal sensors commonly used within electronic device manufacturing systems.

FIGS. 5B-5C illustrate an exemplary embodiment of one of the thermal sensors (574) of the device from above, i.e. FIG. 5B illustrates sensor 574 of FIG. 5A, but can be generalized as sensor 500, and can be exemplary of any of the thermal sensors 520, 524, 530, 534, 570, 574, 580, and 584 shown in FIG. 5A.

Exemplary thermal sensor 500 can comprise a contact point 510, that contacts the substrate resting on the sensor 500, an insert 512, surrounding the contact point, a silicon-semiconductor thermometer (SST) 514, configured to measure the temperature, and a set screw 516 to hold the assembly in place.

In some embodiments, thermal sensor 500 can include a thermal choke, in terms of a thermally conductive material that is contacting the supported substrate, surrounded by a thermally insulative material. In some embodiments this may help to more accurately determine the temperature of the substrate on the device.

In some embodiments, contact point 510 can comprise any feasible shape such as a pad or ball, and serve to contact the substrate. In some embodiments, contact point 510 can comprise a ceramic sphere. In some embodiments, contact point 510 can be a made of silicon nitride, aluminum nitride, silicon carbide, or any other ceramic material or thermally conductive material commonly used in thermal sensors used in electronic device manufacturing systems.

In some embodiments, insert 512 can comprise a thermally insulative material. In some embodiments the thermally insulative material can comprise any commonly used insulative material, such as silica, or a polymer such as polyimide, or any other insulative material commonly used in thermal sensors used in electronic device manufacturing systems. In other embodiments, the thermally insulative material may be a gas, such as an air gap, or any other commonly used gas within insulative gasses commonly used within thermal sensors commonly used in electronic device manufacturing systems.

Thus, thermal sensors 520, 524, 530, 534, 570, 574, 580, and 584 can make use of a thermal choke to more accurately measure and transfer a more accurate measurement of the temperature of one or more substrates supported by the substrate support device.

Figure 6A:
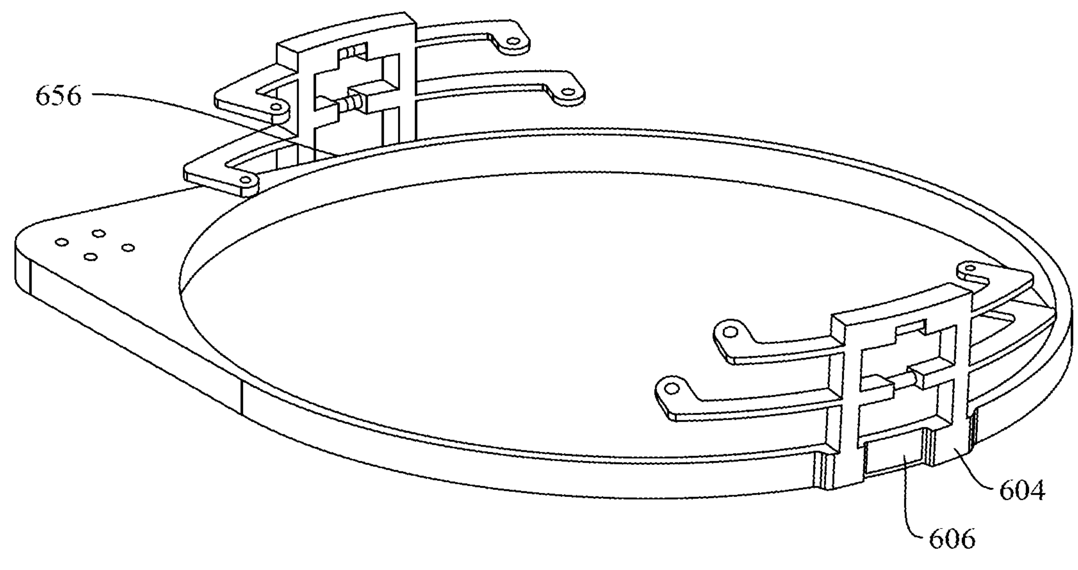
FIG. 6A illustrates a perspective view of an exemplary embodiment of a first sensor elements of a load lock substrate support device.
Figure 6B:
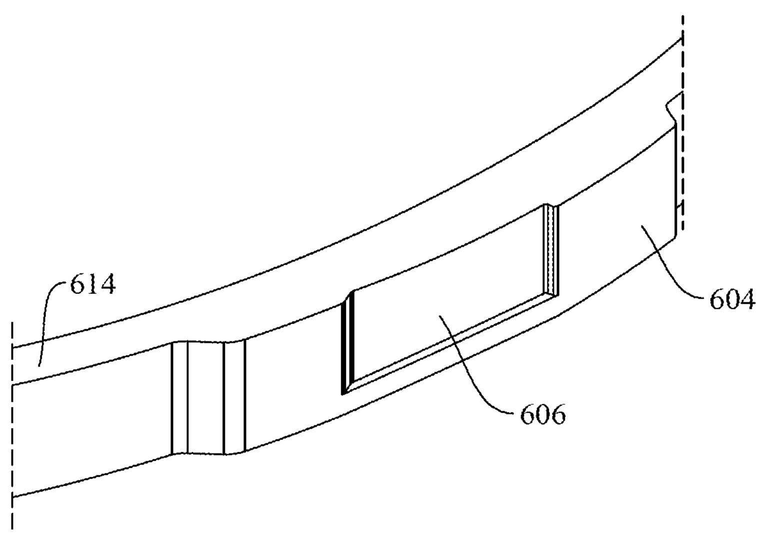
FIG. 6B illustrates a close-up view of an exemplary embodiment of the first sensor element of a load lock substrate support device.

FIGS. 6A and 6B illustrate an exemplary embodiment of a first sensors 606 and 656 of the load lock substrate support device. In some embodiments, the first sensors 606 and 656 may be placed at the base level 604 of first tower portion (and second tower portions, as described in FIG. 2B) and be at the same level as the hoop portion 614 of the substrate support device.

In some embodiments, first sensors 606 and 656 may comprise accelerometers, integrated into the substrate support device. In some embodiments, first sensors 606 and 656 may serve to measure vibrational characteristics through the load lock support device and any other physically-attached system devices e.g. such as an indexer device, that is fixedly-attached to the load lock substrate support device through an attachment portion of substrate support device. In some embodiments, abnormal, or excessive vibrations may be indicative of a broken component of the device, such as a malfunction in the indexer device attached to the substrate support device. In this way, first sensors 606 and 656 may sense that a component has failed, or that a component may require maintenance. An associated computer subsystem may make the determination that a component has failed from first sensors sensor data, and alert a user or operator of the system that such an event has occurred.

In some embodiments, first sensors 606 and 656 can be one of, or any combination of, accelerometers, piezoelectric sensors, capacitive sensors, resistive sensors, or any similar sensors capable of sensing vibration characteristics. In some embodiments, a micro-electro-mechanical systems (MEMS) sensor may be used. In some embodiment, a vibrometer e.g. a laser doppler vibrometer (LDV) or other non-contact sensor may be used to measure vibrations.

Although first sensors 606 and 656 may be placed at the level of, and integral with the hoop portion of the device, in other embodiments, the first sensors may be placed integral with any portion of, the base, first or second towers, arm portions, attachment portion, or any other portion of the substrate support device discussed in the above disclosure. One of ordinary skill in the art, having the benefit of this disclosure, will be able to conceive of other locations of the substrate support device, integrated or not, on which to place first sensors 606 and 656 to accurately sense vibrational characteristics through the substrate support device.

Figure 7A:
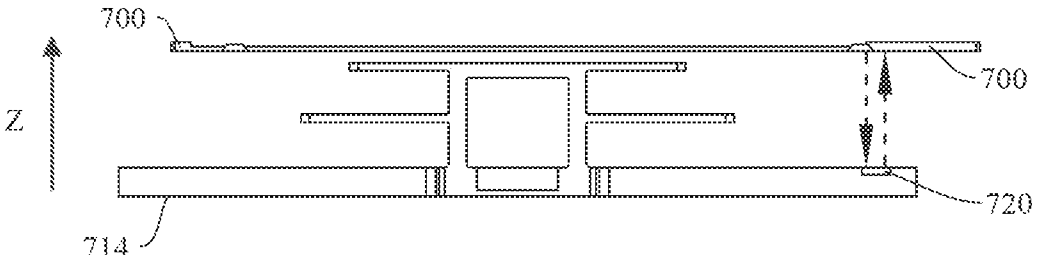
FIG. 7A illustrates a side view of an exemplary embodiment of a load lock substrate support device and a substrate transfer mechanism.
Figure 7B:
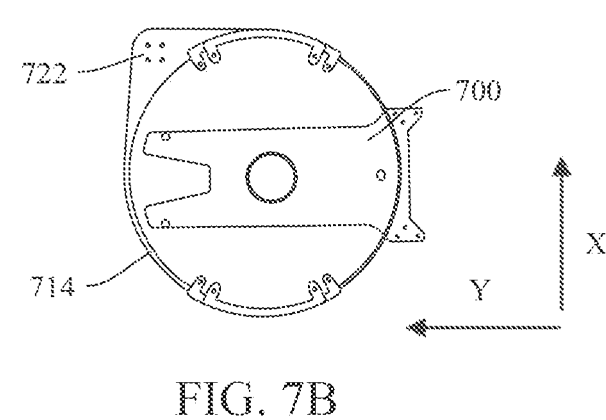
FIG. 7B illustrates a top-down view of an exemplary embodiment of a load lock substrate support device and a substrate transfer mechanism.
Figure 7C:
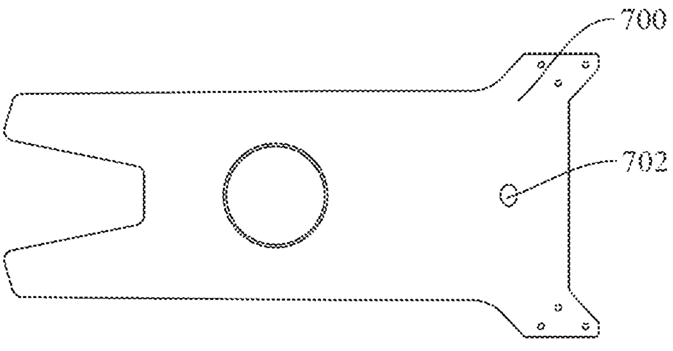
FIG. 7C illustrates a top-down view of an exemplary embodiment of the substrate transfer mechanism.

FIGS. 7A-7C illustrate an exemplary embodiment of a substrate transfer mechanism 700 used to place and remove substrates from the load lock substrate support device. A controller associated with the load lock chamber (such as controller 150 of FIG. 1) and substrate support device may control the movement of the substrate transfer mechanism. Such a controller may include a store of the estimated current position of the substrate transfer mechanism. Over time, the estimated current position may become erroneous or drift erroneously, and become irreflective of the real position or location of the real substrate transfer mechanism 700. Since accurately "knowing" the real-time position of substrate transfer mechanism 700 is paramount to accurately and efficiently interacting with both the substrate support device (e.g. to remove or place a substrate onto, or from, the substrate support device) and the electronic device manufacturing system at large, the controller may require a method for removing errors from its estimated location of substrate transfer mechanism 700. In other words, as small errors are introduced into the real-time system or real-time location of substrate transfer mechanism 700 (e.g. through system vibrations, actuator or actuator belt slippage, or any other error creation), the controller needs a mechanism to update its outdated estimation of the location of transfer mechanism 700. An integrated sensor of the load lock substrate support device can help accomplish this task.

In some embodiments, transfer mechanism 700 may be calibrated in an x-y plane and then in a z direction. For reference, the x-y plane is denoted in FIG. 7B. The x-y plane is viewed "normally" in FIG. 7B, i.e., the x-y plane is parallel with the top or bottom surface of substrate transfer mechanism 700. For reference, the z direction is denoted in FIG. 7A. For reference, the reflective beam of sensor element 720 in FIG. 7A travels in the z direction, i.e. the vertical direction with respect to the substrate support device and load lock chamber.

To accomplish an x-y calibration, an integrated sensor element 720 integrated with hoop portion 714 may be used. Sensor element 720 may be placed along the outer perimeter of the hoop portion 714 at a known position. Sensor element 720 may be a reflective sensor, or some other optical sensor, that may sense when reflective portion 702 on the underside of transfer mechanism 700 (seen in FIG. 7C) is aligned with the sensor element 720 and with load lock substrate support device. When sensor element 720 detects alignment with reflective portion 702 of the substrate transfer mechanism 700, this can indicate to a controller (such as controller 150 in FIG. 1) associated with the substrate transfer mechanism that the substrate transfer mechanism 700 is at a known "calibration" position with respect to the substrate support device. The controller can then update its estimation of the current location of the substrate transfer mechanism 700 to be the previously-known location that is the "calibration" position.

Thus, the controller can then update a stored, and estimated, location of the substrate transfer mechanism 700. Thus, the controller can remove any location errors associated with its stored location of the substrate transfer mechanism 700 location in the x-y plane. In other words, the sensor element 720 can indicate to the controller that the transfer mechanism is in real-time at an exact location. The controller can then update its stored and estimated location to be accurate.

From time-to-time, transfer mechanism may need to be re-calibrated. In some embodiments, the controller can calibrate the transfer mechanism 700 according to a schedule. Other times, a separate sensor, such as a proximity sensor associated with transfer mechanism may indicate that a calibration is necessary. In other embodiments, the controller may infer that calibration is necessary from the data gathered from the photoelectric sensors associated with the load lock substrate support device.

In some embodiments, the reflective portion 702 can be centered along an axis of the substrate transfer mechanism 700. In other embodiments, reflective portion 702 can be offset from an axis of the substrate transfer mechanism 700 by a known quantity.

In some embodiments, sensor element 720 may be centered along an axis of the substrate transfer mechanism 700 when it is in "calibration" position. In other embodiments, sensor element 720 may be offset along the perimeter of the hoop portion 714, so as to align with an offset reflective portion 702 when the substrate transfer mechanism 700 is centered with the load lock substrate support device.

In some embodiments, when the reflective portion 702 is aligned with the reflective sensor element 720, it is indicative that a substrate being transferred onto the substrate support device by the substrate transfer mechanism 700 will be centered on the load lock substrate support device in the x-y plane.

In a method utilized in order to "find" and calibrate the substrate transfer mechanism 700 with the substrate support device and integrated sensor element 720, in some embodiments, the controller associated with the transfer mechanism 700 may cause transfer mechanism 700 to translate along both the x and the y direction in a reciprocating manner until the sensor element 720 receives a reflection from reflective portion 702 to indicate that the x-y "calibration" position and sensor point has been "found" by the system and that the substrate transfer mechanism 700 is indeed at the "calibration" position. The associated controller may calibrate its estimated position of the transfer mechanism 700.

In some embodiments, the substrate transfer mechanism 700 may be caused to translate a first distance in the positive x direction, followed by a small distance in the y direction, followed by a second distance in the negative x direction, followed by a small distance in the y direction, and so on, in a zig-zag movement, until the reflecting portion 702 has been "found" by sensor element 720.

In some embodiments, or vice-versa to the above method, the substrate transfer mechanism 700 may translate a first distance in the positive y direction, followed by a small distance in the x direction, followed by a second distance in the negative y direction, followed by a small distance in the x direction, and so on, until the reflecting portion 702 has been "found" by sensor element 720.

Figure 8:
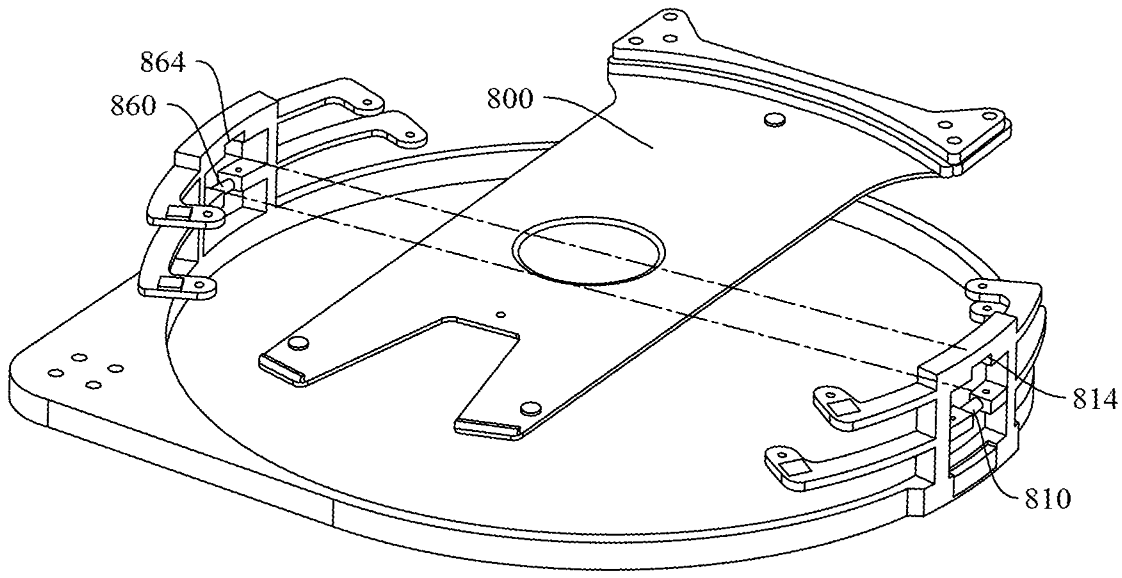
FIG. 8 illustrates a perspective view of an exemplary embodiment of a load lock substrate support device and a substrate transfer mechanism.

FIG. 8 illustrates an exemplary embodiment of the transfer mechanism 800 used to place and remove substrates from the load lock support device. In an embodiment, the z-position (the z direction with respect to the system is denoted in FIG. 7A) may be calibrated through use of the second and third sensor element pairs 810 and 860, and 814 and 864, as was discussed with respect to FIGS. 7A-7C above.

In a similar method as discussed above, by adjusting the z-position of the transfer mechanism 800, and sensing when the sensor element pairs are tripped and/or the sensor beams are broken, an accurate, real-time z-position of the substrate transfer mechanism 800, can be inferred by the system in relation to the substrate support device. In such a way, the position of the substrate transfer mechanism 800 may be determined and updated by a controller associated with the transfer mechanism 800, so as to calibrate the z-position of the transfer mechanism.

In such a way as described above with respect to FIGS. 7A-7C and 8, the substrate transfer mechanism 700 (or 800) may be calibrated to as to accurately deliver or remove a substrate or wafer from the substrate support device.

Figure 9:
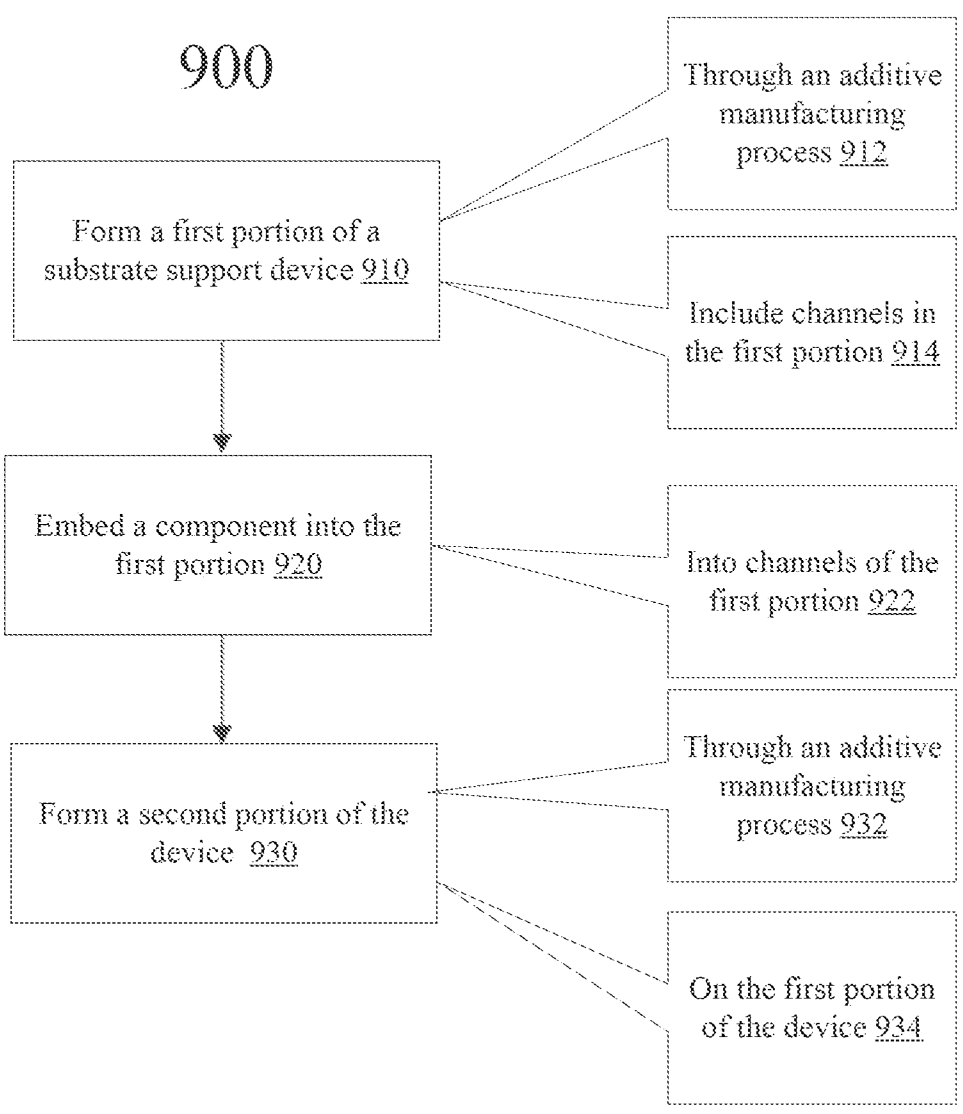
FIG. 9 illustrates a flow diagram of an example method of forming a monolithic substrate support device of a load lock in accordance with one embodiment of the present disclosure.

FIG. 9 is a flow diagram of an example method of forming a monolithic substrate support device of a load lock in accordance with one embodiment of the present disclosure. Method 900 may be performed by a manufacturing device that may include hardware, software, or a combination of both. The manufacturing device may make use of a build material, one or more energy sources, and a digital file to be used as a template for forming the monolithic substrate support device.

At block 910, method 900 may include forming a first portion of the substrate support device. In some embodiments, block 910 may further include an additive manufacturing process as seen in block 912. In some embodiments, block 910 may further include an additive manufacturing process as seen in block 912. In some embodiments, block 910 may further include channels within the first portion of the substrate support device as seen in block 914. Thus, in some embodiments, block 910 may include forming, through an additive manufacturing process, a first portion of the substrate support device, the first portion comprising one or more channels.

At block 920, method 900 may continue with the forming of the monolithic substrate support device by embedding an electrical component into the first portion of the substrate support device. In some embodiments, block 920 may further include embedding the electrical component into channels of the first portion, as seen in block 922. Thus, in some embodiments, block 920 may include embedding an electrical component into the one or more channels of the first portion of the substrate support device.

At block 930, method 900 may continue with the forming of the monolithic substrate support device by forming a second portion of the device that at least partially covers the electrical component. In some embodiments, block 930 may further include an additive manufacturing process as seen in block 932. In some embodiments, block 930 may further include forming the second portion of the device on the first portion of the device, as seen in block 934. Thus, in some embodiments, block 930 may include forming, through the additive manufacturing process, a second portion of the substrate support device on the first portion of the substrate support device, wherein the second portion of the substrate support device at least partially covers the electrical component.

In some embodiments, forming a monolithic substrate support device according to method 900 may include forming a base of the monolithic substrate support device using the additive manufacturing process; forming a first tower portion and a second tower portion of the monolithic substrate support device connected to the base using the additive manufacturing process; and forming a plurality of arms the monolithic substrate support device that are configured to support a substrate using the additive manufacturing process, the plurality of arms extending from the first tower portion and the second tower portion; wherein the first portion of the substrate support device and the second portion of the substrate support device are portions of one of the base, the first tower portion, the second tower portion, or an arm of the plurality of arms.

In some embodiments, forming a monolithic substrate support device according to method 900 may include depositing one or more layers of a build material according to a digital file; solidifying at least a portion of the one or more layers of the build material via a directed energy source according to the digital file; and repeating the depositing and the solidifying for one or more additional layers according to the digital file.

In some embodiments, forming a monolithic substrate support device according to method 900 may include use of an electrical component comprising at least one of: an electronic communications conduit, a plurality of electronic communications conduits, a sensor, or a plurality of sensors.

The modules, components and other features described herein (for example in relation to FIG. 1) can be implemented as discrete hardware components or integrated in the functionality of hardware components such as ASICS, FPGAs, DSPs or similar devices. In addition, the modules can be implemented as firmware or functional circuitry within hardware devices. Further, the modules can be implemented in any combination of hardware devices and software components, or only in software.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a target result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as “receiving”, “identifying”, “determining”, “selecting”, “providing”, “storing”, or the like, refer to the actions and processes of a computer system, or similar electronic computing device, that manipulates and transforms data represented as physical (electronic) quantities within the computer system’s registers and memories into other data similarly represented as physical quantities within the computer system memories or registers or other such information storage, transmission or display devices.

Embodiments of the present invention also relate to an apparatus for performing the operations herein. This apparatus may be specially constructed for the discussed purposes, or it may comprise a general purpose computer system selectively programmed by a computer program stored in the computer system. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to “one embodiment” or “an embodiment” means that a particular feature, structure, or characteristic described in connection with the embodiment is included in at least one embodiment. Thus, the appearances of the phrase “in one embodiment” or “in an embodiment” in various places throughout this specification are not necessarily all referring to the same embodiment. In addition, the term “or” is intended to mean an inclusive “or” rather than an exclusive “or.” When the term “about” or “approximately” is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A load lock, comprising:

a substrate support device, comprising:

a base;

a first tower portion and a second tower portion extending vertically from the base;

a plurality of arms, extending laterally from the first tower portion and the second tower portion, configured to support a substrate; and an integrated sensor, configured to sense a property of at least one of the substrate support device, the load lock, an environment of the load lock, or a substrate;

a through-beam sensor comprising an emitter integrated within the first tower portion at a first height relative to the base and a reflective sensor integrated within the second tower portion at the first height; and an indexer, attached to the substrate support device, configured to adjust a vertical position of the substrate support device.

2. The load lock of claim 1, wherein the base comprises a circular hoop portion, and an attachment portion attached to the indexer.

3. The load lock of claim 1, wherein the plurality of arms comprises a first set of arms configured to support a substrate at a first vertical position and a second set of arms configured to support a substrate at a second vertical position.

4. The load lock of claim 1, wherein the integrated sensor is configured to sense a property of a substrate.

5. The load lock of claim 1, wherein the integrated sensor is configured to sense at least one of, a presence of the substrate, warping of the substrate, or misplacement of the substrate on the substrate support device.

6. The load lock of claim 1, wherein the integrated sensor is a temperature sensor integrated in at least one arm of the plurality of arms, wherein the integrated sensor is to measure a temperature of a substrate on the at least one arm.

7. The load lock of claim 1, wherein at least one arm of the plurality of arms comprises a thermal choke comprising at least one of a pad resting on a material with a lower thermal conductivity than the pad, or a ceramic ball resting within a material with a lower thermal conductivity than the ceramic ball, wherein the ceramic ball or the pad are configured to contact a substrate.

8. The load lock of claim 1, wherein the integrated sensor is a vibration sensor.

9. The load lock of claim 1, wherein the integrated sensor is configured to provide data for automatically aligning a substrate transfer mechanism with the substrate support device.

10. The load lock of claim 1, wherein the integrated sensor is positioned at a first location of the substrate support device and a second integrated sensor is positioned at a second location of the substrate support device, wherein data from the integrated sensor positioned at the first location and the second integrated sensor positioned at the second location is used to align a substrate transfer mechanism with the substrate support device.

11. The load lock of claim 1, wherein the substrate support device comprises a monolithic part.

12. The load lock of claim 1, wherein a plurality of channels are formed within the substrate support device, wherein the plurality of channels comprise at least one of electrically conductive lines that connect to the integrated sensor or optical fibers that provide an optical signal for the integrated sensor.

13. A monolithic substrate support device for a load lock, comprising:

a base;

a first tower portion and a second tower portion extending vertically from the base;

a plurality of arms, extending laterally from the first tower portion and the second tower portion, configured to support a substrate;

an integrated sensor, configured to sense a property of at least one of the substrate support device, the load lock, an environment of the load lock, or a substrate; and a through-beam sensor comprising an emitter integrated within the first tower portion at a first height relative to the base and a reflective sensor integrated within the second tower portion at the first height.

14. The monolithic substrate support device of claim 13, wherein the base comprises a circular hoop portion and an attachment portion for attachment to an indexer, wherein the plurality of arms comprises a first set of arms configured to support a substrate at a first vertical position and a second set of arms configured to support a substrate at a second vertical position, and wherein the integrated sensor is configured to sense a property of a substrate.

15. The monolithic substrate support device of claim 13, wherein at least one arm of the plurality of arms comprises a thermal choke comprising at least one of a pad resting on a material with a lower thermal conductivity than the pad, or a ceramic ball resting within a material with a lower thermal conductivity than the ceramic ball, wherein the ceramic ball or the pad are configured to contact a substrate.

* * * * *